United States Patent
Lee et al.

(10) Patent No.: US 9,524,879 B2
(45) Date of Patent: Dec. 20, 2016

(54) METHOD FOR FABRICATING SEMICONDUCTOR DEVICE HORIZONTALLY SHIFTED CONTACT PLUG PATTERN

(71) Applicant: Samsung Electronics Co., Ltd., Suwon-si, Gyeonggi-do (KR)

(72) Inventors: Jin-Su Lee, Hwaseong-si (KR); Young-Wook Park, Osan-si (KR); Hee-Sook Park, Hwaseong-si (KR); Dong-Bok Lee, Hwaseong-si (KR); Jong-Myeong Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/669,221

(22) Filed: Mar. 26, 2015

(65) Prior Publication Data
US 2016/0027896 A1    Jan. 28, 2016

(30) Foreign Application Priority Data
Jul. 28, 2014    (KR) .................. 10-2014-0095830

(51) Int. Cl.
*H01L 21/336* (2006.01)
*H01L 21/311* (2006.01)
(Continued)

(52) U.S. Cl.
CPC ...... *H01L 21/31111* (2013.01); *H01L 21/0217* (2013.01); *H01L 21/02164* (2013.01); *H01L 21/02167* (2013.01); *H01L 21/288* (2013.01); *H01L 21/76816* (2013.01); *H01L 21/76879* (2013.01); *H01L 21/76895* (2013.01); *H01L 29/4236* (2013.01); *H01L 29/78* (2013.01);
(Continued)

(58) Field of Classification Search
CPC ................ H01L 29/66568; H01L 21/02164; H01L 21/02167; H01L 21/0217; H01L 21/2855; H01L 21/28556; H01L 21/28568; H01L 21/288; H01L 21/31111
USPC ........................................... 438/197
See application file for complete search history.

(56) References Cited

U.S. PATENT DOCUMENTS 6,030,866 A * 2/2000 Choi ................. H01L 27/10852
257/E21.009
6,352,920 B1    3/2002 Shimomura
(Continued)

FOREIGN PATENT DOCUMENTS

KR    0749367 B1    6/2007
KR    0836763 B1    6/2008
(Continued)

*Primary Examiner* — Matthew Gordon
(74) *Attorney, Agent, or Firm* — Harness, Dickey & Pierce, P.L.C.

(57) ABSTRACT

Semiconductor devices, and methods for fabricating a semiconductor device, include forming a contact hole penetrating an interlayer insulating layer and exposing a conductor defining a bottom surface of the contact hole, forming a sacrificial layer filling the contact hole, forming a first trench overlapping a part of the contact hole by removing at least a part of the sacrificial layer, forming a spacer filling the first trench, forming a second trench by removing a remainder of the sacrificial layer, and forming a metal electrode filling the contact hole and the second trench using electroless plating.

20 Claims, 16 Drawing Sheets

(51) Int. Cl.
  *H01L 21/768* (2006.01)
  *H01L 21/288* (2006.01)
  *H01L 21/02* (2006.01)
  *H01L 29/423* (2006.01)
  *H01L 29/78* (2006.01)

(52) U.S. Cl.
  CPC .... *H01L 21/76843* (2013.01); *H01L 21/76844* (2013.01); *H01L 21/76855* (2013.01)

(56) References Cited

U.S. PATENT DOCUMENTS

| | | |
|---|---|---|
| 6,724,085 B2 | 4/2004 | Tomita |
| 7,064,059 B2 | 6/2006 | Kim et al. |
| 7,514,354 B2 | 4/2009 | Park et al. |
| 7,638,433 B2 | 12/2009 | Yun et al. |
| 7,663,237 B2 | 2/2010 | Peng et al. |
| 7,879,720 B2 | 2/2011 | Jang et al. |
| 7,902,631 B2 | 3/2011 | Che |
| 8,426,310 B2 | 4/2013 | Adetutu et al. |
| 8,497,207 B2 | 7/2013 | Yun et al. |
| 2012/0235302 A1 | 9/2012 | Furuya |

FOREIGN PATENT DOCUMENTS

| | | |
|---|---|---|
| KR | 20090019136 A | 2/2009 |
| KR | 20110003190 A | 1/2011 |

* cited by examiner

METHOD FOR FABRICATING SEMICONDUCTOR DEVICE HORIZONTALLY SHIFTED CONTACT PLUG PATTERN

CROSS-REFERENCE TO RELATED APPLICATIONS

This application is based on and claims priority, under 35 U.S.C. §119, to Korean Patent Application No. 10-2014-0095830, filed on Jul. 28, 2014, in the Korean Intellectual Property Office, the disclosure of which is incorporated herein in its entirety by reference.

BACKGROUND

1. Field

Example embodiments relate to semiconductor devices and methods for fabricating the same.

2. Description of the Related Art

As semiconductor devices become more highly-integrated, space in the semiconductor devices is reduced. Accordingly, a space in which layers overlap each other becomes insufficient in the semiconductor device, and accordingly it has become an important matter of design to secure such a space, that is, to secure an overlap margin.

In a process of designing a semiconductor device that secures the overlap margin, design and processes, which take into account other limit factors (e.g., process efficiency, the degree of difficulty of the process, and precision), are required.

Among various methods, a method for modifying the shape of a contact may be applied to secure the overlap margin. However, such a method for modifying the shape of the contact may cause high difficulty in the current processes, and may deteriorate the process efficiency. Accordingly, the focus is to find a process of an appropriate efficiency level.

SUMMARY

Example embodiments relate to semiconductor devices and methods for fabricating the same.

One object to be solved by example embodiments of the present inventive concepts is to provide methods for fabricating a semiconductor device which includes asymmetric contacts to secure an overlap margin.

Another object to be solved by example embodiments of the present inventive concepts is to provide semiconductor devices which include asymmetric contacts to secure an overlap margin.

Additional advantages, objects, and features of the example embodiments of will be set forth in part in the description which follows and in part will become apparent to those having ordinary skill in the art upon examination of the following or may be learned from practice of the invention.

In some example embodiments of the present inventive concepts, there is provided a method for fabricating a semiconductor device, including forming a transistor including first and second source/drain regions and a bit line connected to the first source/drain region of the transistor on a substrate, forming an interlayer insulating layer covering the transistor and the bit line, forming first and second contact holes exposing the second source/drain region of the transistor on both side surfaces of the bit line so as to penetrate the interlayer insulating layer, forming a sacrificial layer on the interlayer insulating layer and filling the first and second contact holes, forming a first trench separating the sacrificial layer filling the first contact hole and the sacrificial layer filling the second contact hole from each other by removal of at least a part of the sacrificial layer, forming a spacer filling the first trench, forming a second trench on the first contact hole and overlapping a part of the first contact hole and a part of the interlayer insulating layer on a side surface of the first contact hole, by removal of a first portion of a remainder of the sacrificial layer, forming a third trench on the second contact hole, and overlapping a part of the second contact hole and a part of the interlayer insulating layer on a side surface of the second contact hole, by removal of a second portion of the remainder of the sacrificial layer, forming a contact plug filling the first and second contact holes and forming a metal pattern filling the second and third trenches.

The forming the contact plug and the forming the metal pattern may be simultaneously formed.

The sacrificial layer may include a material having an etching selection ratio higher than an etching selection ratio of the spacer, and the removal of the first and second portions of the sacrificial layer may be performed by wet etching using the etching selection ratio of the material.

The sacrificial layer may include an oxide-based material, and the spacer may include a nitride-based material.

A horizontal cross-section of the second trench may be wider than a horizontal cross-section of the first trench.

The forming the contact plug may be performed using chemical vapor deposition (CVD), physical vapor deposition (PVD), or electroless plating.

The first trench may be formed to overlap the part of the first contact hole.

The first trench may be formed so that a center of the first trench is shifted from a center of the first contact hole in a first direction, and the second trench may be formed so that a center of the second trench is shifted from the center of the first contact hole in a second direction opposite to the first direction.

The contact plug may entirely fill the first and second contact holes.

In other example embodiments of the present inventive concepts, there is provided a method for fabricating a semiconductor device including forming a contact hole penetrating an interlayer insulating layer and exposing a conductor defining a bottom surface of the contact hole, forming a sacrificial layer filling the contact hole, forming a first trench overlapping a part of the contact hole by removing at least a part of the sacrificial layer, forming a spacer filling the first trench, forming a second trench by removing a remainder of the sacrificial layer and forming a metal electrode filling the contact hole and the second trench using electroless plating.

The metal electrode includes at least one selected from the group consisting of W, Co, Ni, Cu, Ru, Pd, Ag, Pt, Au, In, Sn, CoW, CoWP, and NiB.

The interlayer insulating layer includes at least one selected from the group consisting of $SiO_2$, doped $SiO_2$, SiN, and SiCN.

The method for fabricating a semiconductor device may further include forming a barrier metal on the contact hole and the interlayer insulating layer after forming the contact hole.

The method for fabricating a semiconductor device may further include adjusting conductivity through doping of the barrier metal.

The liner may include at least one selected from the group consisting of TiN, Ti, W, Co, Ru, RuO, and RuTiN.

According to yet other example embodiments, a method for fabricating a semiconductor device includes forming a transistor including a first conductive region and a second conductive region on a substrate, forming an interlayer insulating pattern on the transistor, wherein the interlayer insulating pattern has a first contact hole and a second contact hole separated from each other, and the first conductive region is exposed by the first contact hole and the second conductive region is exposed by the second contact hole, and filling the first contact hole with a first contact plug and the second contact hole with a second contact plug, wherein the first and second contact plugs are each formed collectively of a first metal pattern and a second metal pattern arranged along different longitudinal axes.

The forming an interlayer insulating pattern may include forming a first interlayer insulating pattern having a first preliminary contact hole exposing the first conductive region and a second preliminary contact hole exposing the second conductive region, filling the first and second preliminary contact holes with a sacrificial layer, etching the sacrificial layer so as to form a first sacrificial layer and a second sacrificial layer separated from each other by a trench, wherein an upper portion and a lower portion of the first and second sacrificial layers collectively form a step, and removing the first and second sacrificial layers.

The sacrificial layer may be formed of a material having an etching selection ratio with respect to the first interlayer insulating layer pattern.

The interlayer insulating pattern may be formed with non-linear sidewalls forming each of the first and second contact holes.

The second metal pattern may be a storage node.

BRIEF DESCRIPTION OF THE DRAWINGS

Example embodiments will be more clearly understood from the following detailed description taken in conjunction with the accompanying drawings.

FIG. 1 is a partial perspective view explaining a semiconductor device according to first example embodiments of the present inventive concepts;

FIG. 2 is a layout diagram as seen in a direction A of FIG. 1, explaining a semiconductor device according to the first example embodiments of the present inventive concepts;

FIG. 3 is a cross-sectional view taken along line B-B of FIG. 2, explaining a semiconductor device according to the first example embodiments of the present inventive concepts;

FIG. 4 is an enlarged cross-sectional view of a portion C of FIG. 3, explaining a semiconductor device according to the first example embodiments of the present inventive concepts;

FIGS. 5 to 9 are views of intermediate steps explaining a method for fabricating a semiconductor device according to the first example embodiments of the present inventive concepts;

FIG. 10 is a cross-sectional view explaining a semiconductor chip according to second example embodiments of the present inventive concepts;

FIG. 11 is a view of an intermediate step explaining a method for fabricating a semiconductor device according to the second example embodiments of the present inventive concepts;

FIG. 12 is a block diagram illustrating an example of an electronic system including a semiconductor device fabricated according to a method for fabricating a semiconductor device according to example embodiments of the present inventive concepts;

FIG. 13 is a block diagram illustrating an example of a memory card including a semiconductor device fabricated according to a method for fabricating a semiconductor device according to example embodiments of the present inventive concepts;

FIGS. 14 and 15 are views of an exemplary semiconductor system to which a semiconductor device according to example embodiments of the present inventive concepts can be applied; and FIG. 16 is a cross-sectional view of a semiconductor device according to third example embodiments of the present inventive concepts.

DETAILED DESCRIPTION OF EXAMPLE EMBODIMENTS

Figure 1:
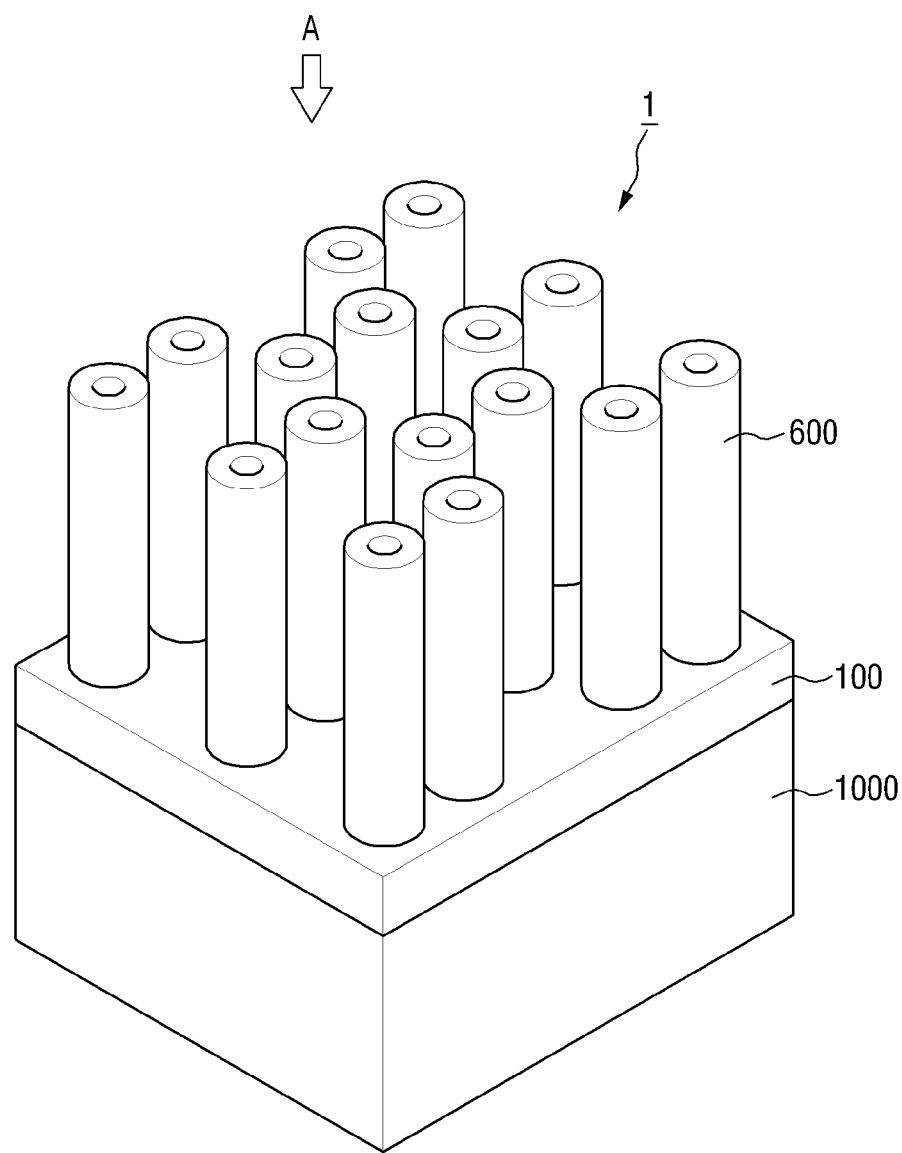
FIGS. 1-16 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Example embodiments relate to semiconductor devices and methods for fabricating the same.

Referring to FIGS. 1 to 4, a semiconductor device according to first example embodiments of the present inventive concepts will be described.

Figure 2:
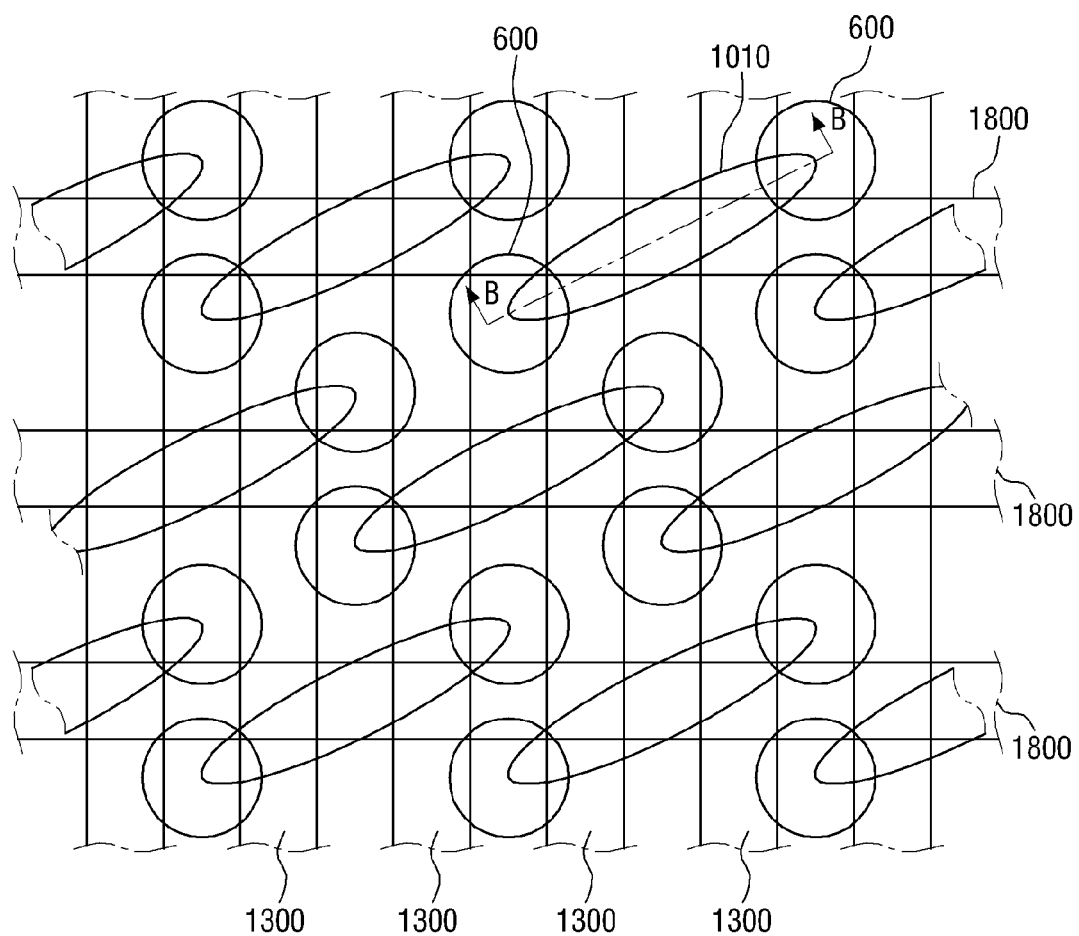
Figure 3:
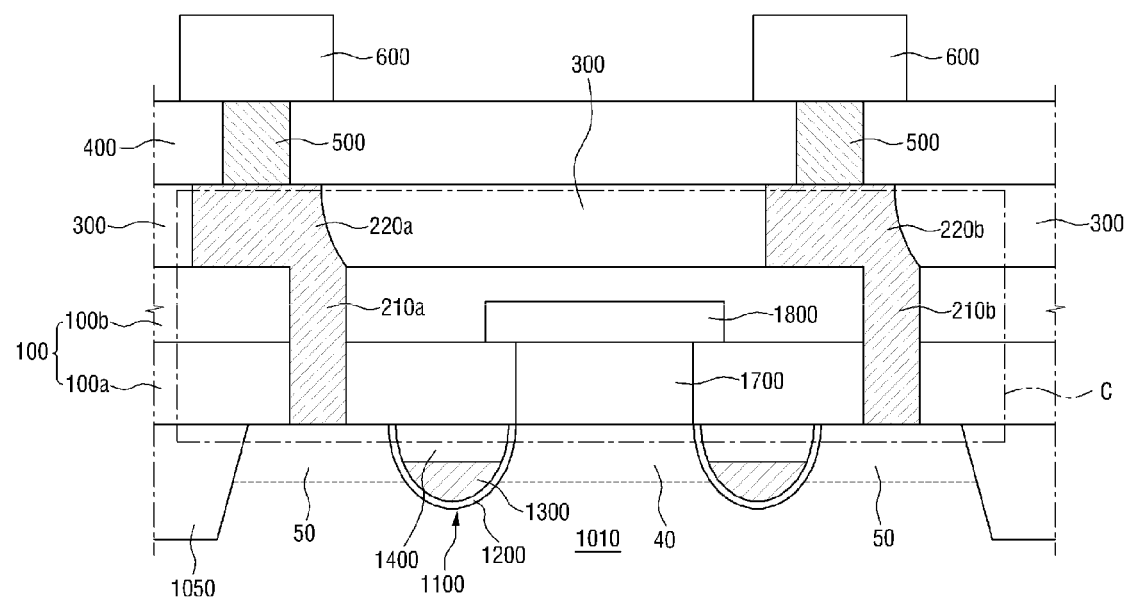
Figure 4:
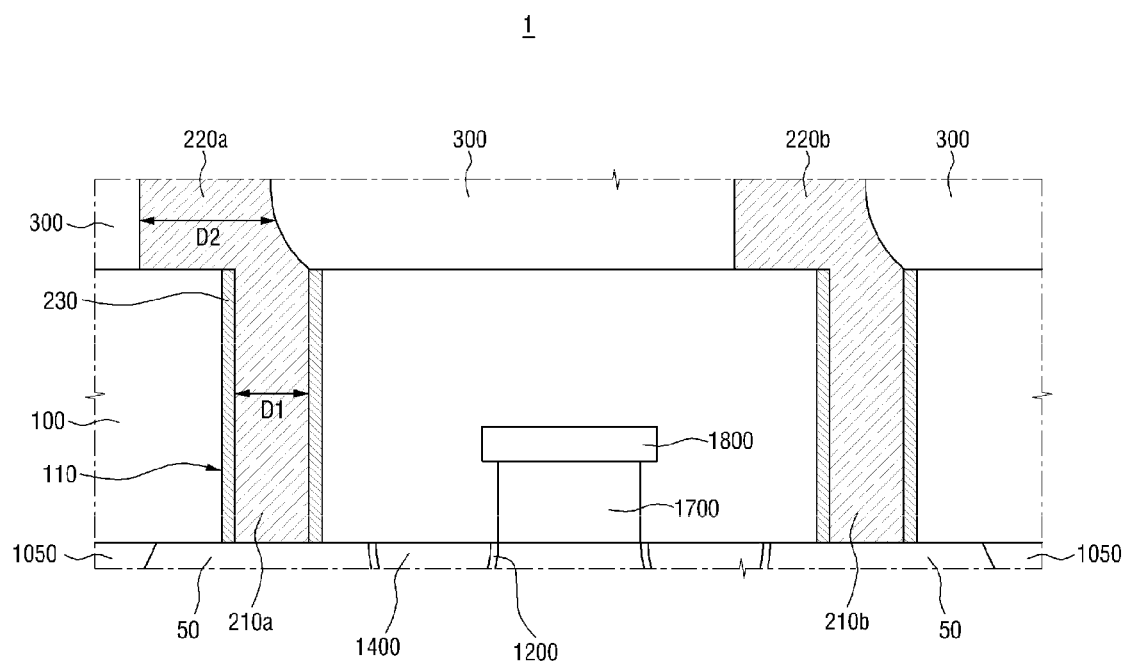

FIG. 1 is a partial perspective view explaining a semiconductor device according to first example embodiments of the present inventive concepts, and FIG. 2 is a layout diagram as seen in a direction A of FIG. 1, explaining a semiconductor device according to the first example embodiments of the present inventive concepts. FIG. 3 is a cross-sectional view taken along line B-B of FIG. 2, explaining a semiconductor device according to the first embodiments of the present inventive concepts, and FIG. 4 is an enlarged cross-sectional view of a portion C of FIG. 3, explaining a semiconductor device according to the first example embodiments of the present inventive concepts.

Referring to FIGS. 1 to 5, a semiconductor device 1 according to first embodiments of the present inventive concept includes a substrate 1000, a first interlayer insulating layer 100, contact plugs 210a and 210b, landing pads 220a and 220b, a spacer 300, a second interlayer insulating layer 400, a storage contact 500, a storage node 600, and a bit line 1800.

The substrate 1000 may be divided into an isolation region 1050 and an active region 1010. The active region 1010 is defined by forming the isolation region in the substrate 1000. Specifically, referring to FIGS. 1 and 3, the active region 1010 is formed to extend in a first direction DR1, a gate electrode (i.e., word line) 1300 is formed to extend in X direction that forms an acute angle with the first direction DR1, and the bit line 1800 is formed to extend in Y direction that forms an acute angle with the first direction DR1. At both ends of the active region 1010, the storage node 600 may be formed.

Here, the angle in the case where "a specific direction and another specific direction form a predetermined (or set) angle" means a lower angle of two angles that are formed through crossing of two directions. For example, if angles that may be formed through crossing of two directions are 120° and 60°, the angle means 60°. Accordingly, as illustrated in FIG. 1, the angle that is formed by the first direction DR1 and the X direction becomes θ1, and the angle that is formed by the first direction DR1 and the Y direction becomes θ2.

As described above, the reason why θ1 and/or θ2 form an acute angle is to maximally secure a gap between a bit line contact 1700 connecting the active region 1010 and the bit line 1800, and a contact plug 210 (a, b) connecting the active region 1010 and a storage element. θ1 and θ2 may be, for example, 45° and 45°, 30° and 60°, or 60° and 30°, but are not limited thereto.

Specifically, the substrate 1000 may be a rigid substrate, such as a silicon substrate, a SOI (Silicon On Insulator) substrate, a gallium arsenide substrate, a silicon germanium substrate, a ceramic substrate, a quartz substrate, or a glass substrate for display, or a flexible plastic substrate that is made of polyimide, polyester, polycarbonate, polyethersulfone, polymethylmethacrylate, polyethylenenaphthalate, or polyethyleneterephthalate.

The isolation region 1050 is formed in the substrate 1000 to define the active region 1010. The isolation region 1050 has superior isolation characteristics and a small occupation area, and thus may be formed in an STI (Shallow Trench Isolation) structure that has the advantage of high integration, but is not limited thereto. The isolation region 1050 may include, for example, at least one of silicon oxide, silicon nitride, silicon oxynitride, and a combination thereof.

A burial trench 1100 is formed in the substrate 100 of the active region 1010. The burial trench 1100 may have various shapes. For example, a connection portion of a bottom surface and a side wall of the burial trench 1100 may be, for example, in a round shape. Further, the burial trench 1100 may have the side wall that is tilted at a predetermined (or set) angle.

The gate insulating layer 1200 is formed along the burial trench 1100. The gate insulating layer 1200 may include, for example, silicon oxide, silicon nitride, silicon oxynitride, or a high-k material. The high-k material may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

The gate electrode 1300 may be formed by filling at least a part of the burial trench 1100 on which the gate insulating layer 1200 is formed. That is, the gate electrode 1300 may be in a recessed shape. The upper surface of the gate electrode 1300 may be lower than the upper surface (surface) of the substrate 1000. The gate electrode 1300 may include a conductive material, for example, metal or poly silicon, but is not limited thereto.

A capping pattern 1400 may be formed by filling the remainder of the burial trench 1100 on which the gate electrode 1300 is formed. The capping pattern 1400 may include, for example, at least one of silicon oxide, silicon nitride, and silicon oxynitride.

A source/drain region 40 is formed between the gate electrodes 1300. A second source/drain region 50 is formed between the gate electrode 1300 and the isolation region 1050. In other works, two transistors may be formed in the active region 1010. In this case, the first source/drain region 40 is shared by two adjacent transistors, and the second source/drain region 50 is not shared by the two adjacent transistors.

As illustrated in FIG. 3 as described above, a gate may be formed in the burial trench 1100 or on the upper surface of the substrate 1000. That is, instead of forming the burial trench 1100 in the substrate 1000, a gate structure may be formed on the substrate 1000 to form a transistor. The gate structure may include a gate electrode 1300, that is, a word line 1300, a gate insulating layer, and a gate spacer. The first source/drain region 40 and the second source/drain region 50 may be formed on both side surfaces of the gate structure, and the gate structure may operate as a transistor.

The first interlayer insulating layer 100 may be formed on the substrate 1000. The first interlayer insulating layer 100 may be formed using silicon oxide, such as BSG (BoroSilicate Glass), PSG (PhosphoSilicate Glass), BPSG (BoroPhosphoSilicate Glass), USG (Undoped Silicate Glass), TEOS (TetraEthylOrthoSilicate Glass), or HDP-CVD (High Density Plasma-CVD).

The first interlayer insulating layer 100 may include at least one of $SiO_2$, doped $SiO_2$, SiN, and SiCN. The first interlayer insulating layer 100 may be a single layer or a multilayer. If the first interlayer insulating layer 100 is a multilayer, it may include a first lower interlayer insulating layer 100a and a first upper interlayer insulating layer 100b.

The bit line contact 1700 may be formed to penetrate (or extend through) the first lower interlayer insulating layer 100a. The bit line contact 1700 may include a conductive material, and may include, for example, at least one of poly silicon, metal silicide compound, conductive metal nitride, and metal, but is not limited thereto.

The bit line 1800 that is electrically connected to the bit line contact 1700 may be formed on the bit line contact 1700. The bit line 1800 may include a conductive material, and may include, for example, at least one of poly silicon, metal silicide compound, conductive metal nitride, and metal, but is not limited thereto.

The first upper interlayer insulating layer 100b may be formed on the first lower interlayer insulating layer 100a and the bit line 1800. The first upper interlayer insulating layer 100b may include substantially the same material as the material of the first lower interlayer insulating layer 100a, but is not limited thereto.

A contact hole 110 may be formed to penetrate the first interlayer insulating layer 100. The contact hole 110 may be vertically formed on the second source/drain region 50. A side wall of the contact hole 110 may be the first interlayer insulating layer 100, and a bottom surface thereof may be the second source/drain region 50.

A barrier metal 230 may be formed on the side wall of the contact hole 110. FIG. 4 illustrates that the barrier metal 230 is formed only on the side walls of the contact hole 110, but is not limited thereto. In other example embodiments, the barrier metal 230 may also be formed on the bottom surface of the contact hole 110.

The barrier metal 230 may include at least one of TiN, WN, and TaN, but is not limited thereto. Conductivity of the barrier metal 230 may be adjusted through doping.

Specifically, the conductivity of the barrier metal 230 that comes in contact with the bottom surface of the contact hole 110 may be heightened through doping. Accordingly, a contact resistance between the contact plugs 210a and 210b and the source/drain region may be lowered.

The conductivity of the barrier metal 230 that comes in contact with the side surface of the contact hole 110 may be lowered through doping. Accordingly, insulation between the contact plugs 210a and 210b and the first interlayer insulating layer 100 may be further strengthened.

The barrier metal 230 may be formed in a symmetric shape. Specifically, the barrier metal 230 may be formed on inner walls of the first contact hole 110a and the second contact hole 110b, and may have an upper surface of the same plane through a planarization process.

The contact plugs 210a and 210b may be formed to penetrate the first interlayer insulating layer 100. The contact plugs 210a and 210b may be vertically formed on the second source/drain region 50. The contact plugs 210a and 210b may include conductors, and may be electrically connected to the second source/drain region 50. The contact plugs 210a and 210b may be connected to the landing pads 220a and 220b that are on upper portions thereof. The contact plugs 210a and 210b may include at least one of W, Co, Ni, Cu, Ru, Pd, Ag, Pt, Au, In, Sn, CoW, CoWP, and NiB, but are not limited thereto.

The landing pads 220a and 220b may be formed on the upper portions of the contact plugs 210a and 210b. The landing pads 220a and 220b may be electrically connected to the contact plugs 210a and 210b on the upper portions of the contact plugs 210a and 210b. The landing pads 220a and 220b may not be aligned with the contact plugs 210a and 210b, but may be asymmetric with respect to the contact plugs 210a and 210b. The landing pads 220a and 220b may be integrally formed with the contact plugs 210a and 210b. Accordingly, like the contact plugs 210a and 210b, the landing pads 220a and 220b may include at least one of W, Co, Ni, Cu, Ru, Pd, Ag, Pt, Au, In, Sn, CoW, CoWP, and NiB, but are not limited thereto.

A plurality of contact plugs 210a and 210b may be provided. Further, a plurality of landing pads 220a and 220b may be provided. The contact plugs 210a and 210b may be connected to the landing pads 220a and 220b in a one-to-one manner (or ratio). The plurality of contact plugs 210a and 210b may be separated from each other, and the plurality of landing pads 220a and 220b may also be separated from each other.

The spacer 300 may be formed on the first interlayer insulating layer 100 and the contact plugs 220a and 220b.

The spacer 300 may be formed on side walls of the landing pads 220a and 220b. The spacer 300 may separate the plurality of landing pads 220a and 220b from each other. The spacer 300 may be formed of an insulator. The spacer 300 may be made of an oxide-based material or a nitride-based material, but is not limited thereto.

The spacer 300 may overlap with a part of the contact hole 110 and a part of the first interlayer insulating layer 100 on the side surface of the contact hole 110. As illustrated, the spacer 300 may be in asymmetric shape and may extend over the contact hole 110 and the first interlayer insulating layer 100, but is not limited thereto. The spacer 300 may overlap with only a part of the first interlayer insulating layer 100. That is, it is enough for the spacer 300 to be shaped so that the landing pads 220a and 220b have a higher overlap margin than the overlap margin of the contact plugs 210a and 210b. The shape of the spacer 300 is not specially limited, but may be asymmetric.

In accordance with the position of the spacer 300, the landing pads 220a and 220b may be shaped contrary to the contact plugs 210a and 210b. Specifically, the center of the landing pads 220a and 220b may be contrary to the center of the contact plugs 210a and 210b, and the landing pads 220a and 220b may be shaped to be pushed in an opposite direction to the position of the spacer 300 based on the contact plugs 210a and 210b. Accordingly, the upper surfaces of the contact plugs 210a and 210b may overlap both the spacer 300 and the landing pads 220a and 220b.

The second interlayer insulating layer 400 may be formed on the landing pads 220a and 220b and the spacer 300. The second interlayer insulating layer 400 may include, for example, at least one of silicon oxide, silicon nitride, and silicon oxynitride. The second interlayer insulating layer 400 may be a single layer or a multilayer.

The storage contact 500 may be formed to penetrate (or extend through) the second interlayer insulating layer 400. The storage contact 500 may electrically connect the storage node 600 and the landing pads 220a and 220b to each other. The storage node 600 may be electrically connected to the storage contact 500, the landing pads 220a and 220b, the contact plugs 210a and 210b, and the second source/drain region 50. The storage node 600 may serve to store an electrical signal.

Among the above-described constituent elements, the landing pads 220a and 220b or the storage contact 500 may be omitted, or may be a part of another constituent element according to example embodiments. That is, if the contact plugs 210a and 210b are connected to the storage node 600, this case corresponds to example embodiments of the present inventive concepts. In this case, like the landing pads 220a and 220b, the storage node 600 may be in an asymmetric shape.

In the semiconductor device according to the first example embodiments of the present inventive concepts, the landing pads 220a and 220b may be formed to be shifted in comparison to the contact plugs 210a and 210b as described above. That is, only a part of the landing pads 220a and 220b may overlap the contact plugs. Accordingly, the overlap margin can be secured in a highly integrated semiconductor device.

Specifically, referring to FIG. 4, the width d1 of the horizontal cross-section of the contact plugs 210a and 210b may be smaller than the width d2 of the horizontal cross-section of the landing pads 220a and 220b. Due to this, wires that are to be electrically connected to the contact plugs 210a and 210b can be connected to the landing pads 220a and 220b more easily, and thus the overlap margin can be secured more easily in the highly integrated semiconductor device.

Hereinafter, referring to FIGS. 4 to 9, a method for fabricating a semiconductor device according to the first example embodiments of the present inventive concepts will be described. Explanation of the duplicate contents as described above will be simplified or omitted.

FIGS. 5 to 9 are views of intermediate steps explaining a method for fabricating a semiconductor device according to the first example embodiments of the present inventive concepts.

Figure 5:
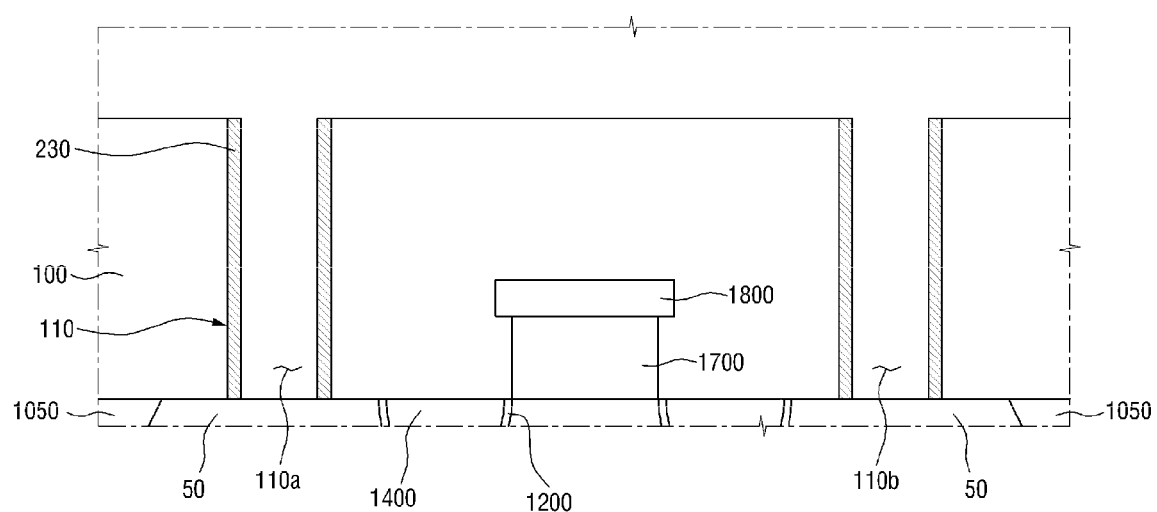

Referring to FIG. 5, a transistor is formed, and a first interlayer insulating layer 100 that covers the upper surface of the transistor is formed. A bit line contact 1700 and a bit line 1800, which are connected to a first source/drain region (first source/drain 40 shown in FIG. 3) to penetrate the first interlayer insulating layer 100, are formed, and a contact hole 110 that exposes a second source/drain region 50 is formed on both side surfaces of the bit line 1800.

A barrier metal 230 may be formed on an inner wall of the contact hole. The barrier metal 230 may be conformally formed along the bottom side of the contact hole 110. The barrier metal 230 may include a metal nitride. The barrier metal 230 may include, for example, any one of TiN, TaN, and WN, or a combination thereof, and may be formed with an appropriate thickness according to the kind of a device to be formed. Although FIG. 5 illustrates that the barrier metal 230 is formed only on the side walls of the contact hole 110, the barrier metal 230 may be formed on the bottom surface of the contact hole 110. In the case where the barrier metal 230 is formed on both the bottom surface and the side surface of the contact hole 110, it becomes possible to adjust conductivity of the barrier metal 230 formed on the bottom surface and the side surface of the contact hole 110. That is, the conductivity of the barrier metal 230 formed on the bottom surface of the contact hole 110 may be heightened, and the conductivity of the barrier metal 230 formed on the side surface of the contact hole 110 may be lowered through doping. This is to lower the contact resistance of the bottom surface of the contact plugs 210a and 210b and to heighten the contact resistance of the side surface of the contact plugs 210a and 210b.

The barrier metal 230 may be formed on not only the inner wall of the contact hole 110 but also the upper surface of the first interlayer insulating layer 100, but the barrier metal 230 formed on the upper surface of the first interlayer insulating layer 100 may be removed through a planarization process such as CMP. This may be a process for isolation.

Figure 6:
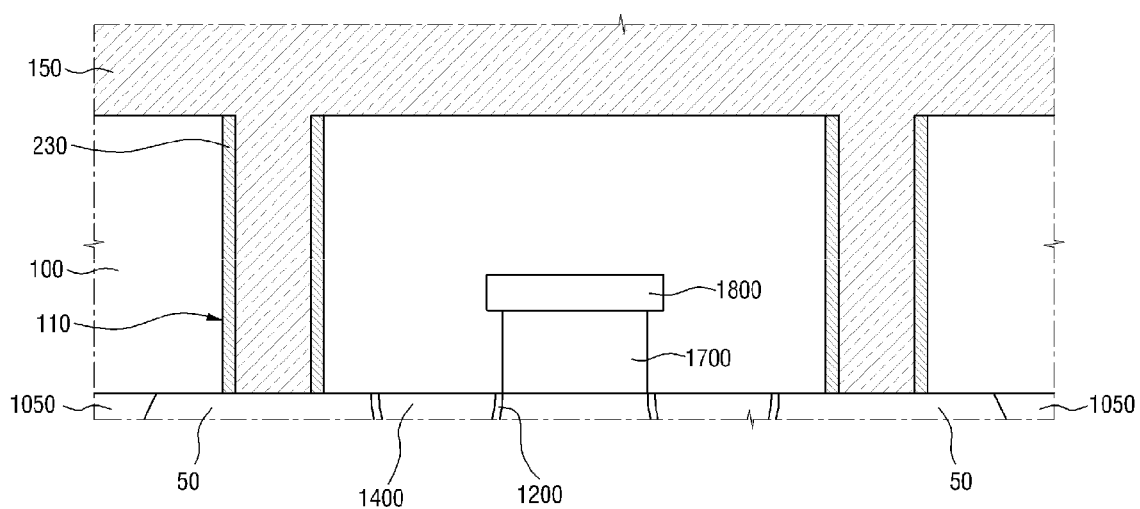

Then, referring to FIG. 6, a sacrificial layer 150 is formed on the contact hole 110 and the upper surface of the first interlayer insulating layer 100. The sacrificial layer 150 may fill the contact hole 110. The sacrificial layer 150 may entirely fill the contact hole 110 and may be formed on the upper surface of the first interlayer insulating layer 100 with a predetermined (or set) thickness. The sacrificial layer 150 may act as a mold for forming the spacer 300 later. Accordingly, the thickness of the sacrificial layer 150 that is formed on the first interlayer insulating layer 100 may be appropriately determined in consideration of the thickness of the spacer 300.

The sacrificial layer 150 may include a material having an etching selection ratio with respect to the first interlayer insulating layer 100 and the barrier metal 230. The sacrificial layer 150 is etched to be removed later, and thus it is advantageous that the sacrificial layer 150 is made of a material having high etching selection ratio.

Figure 7:
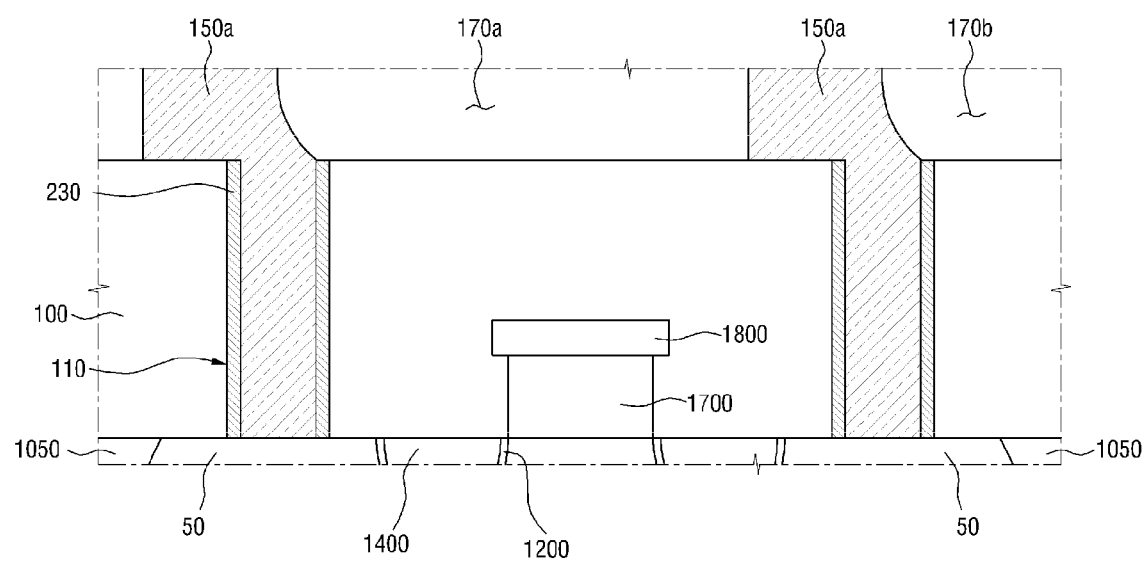

Then, referring to FIG. 7, first trenches 170a and 170b are formed by etching a part of the sacrificial layer 150. Because a plurality of contact holes 110 are provided, the first trenches 170a and 170b are formed to separate the plurality of contact holes 110 from each other.

Specifically, the contact hole 110 includes a first contact hole 110a and a second contact hole 110b, and isolation between the first contact hole 110a and the second contact hole 110b is required. Accordingly, the first trenches 170a and 170b may be formed to separate the first sacrificial layer 150a that fills the first contact hole 110a, and the second sacrificial layer 150b that fills the second contact hole 110b, from each other. Etching to form the first trenches 170a and 170b may include wet etching.

FIG. 7 exemplarily illustrates two contact holes 110. Because two or more contact holes 110 are provided, a plurality of first trenches 170a and 170b may be formed to separate the respective contact holes 110 from each other.

The first trenches 170a and 170b may be formed so that the center of the first trenches 170a and 170b is shifted from the center of the first contact holes in a first direction. FIG. 7 exemplarily illustrates that the first direction is a rightward direction, but is not limited thereto. In accordance with the position of the first trenches 170a and 170b, the first sacrificial layer 150a may be shaped to have a vertical lower portion that fills the contact hole 110, and an asymmetric upper portion that is arranged contrary to the lower portion. The first trenches 170a and 170b may overlap a part of the first interlayer insulating layer 100 and may overlap a part of the first contact hole 110a, but are not limited thereto. The first trenches 170a and 170b may overlap only a part of the first interlayer insulating layer 100, but may not overlap a part of the first contact hole 110a at all.

Figure 8:
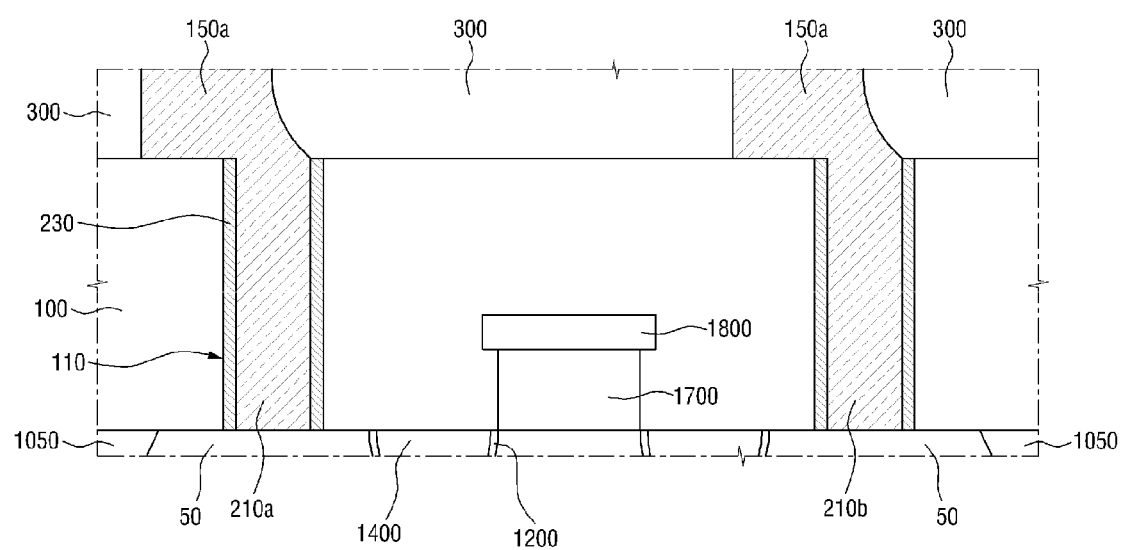

Then, referring to FIG. 8, the spacer 300 is formed to fill the first trenches 170a and 170b. The spacer 300 may entirely fill the first trenches 170a and 170b. Accordingly, the spacer 300 may have the same shape as the shape of the first trenches 170a and 170b. Specifically, the spacer 300 may overlap a part of the first interlayer insulating layer 100 and may overlap a part of the first contact hole 110a, but is not limited thereto. The spacer 300 may not overlap the first contact hole 110a, but may overlap the first interlayer insulating layer 100.

According to the method for fabricating a semiconductor device according to example embodiments of the present inventive concepts, the spacer 300 may be formed prior to a metal electrode, the contact plugs 210a and 210b, and the landing pads 220a and 220b. Accordingly, in comparison to the method for fabricating a semiconductor device, in which the metal electrode for forming the contact plugs 210a and 210b and the landing pads 220a and 220b first fill the contact hole, and then, for isolation, the metal electrode is etched to form the contact plugs 210a and 210b and the landing pads 220a and 220b, the shape of the spacer 300 can be easily formed.

Specifically, in the case of etching the metal, the first interlayer insulating layer 100 or the barrier metal 230 may be partially etched in a metal etching process because the etching selection ratio of the metal and the interlayer insulating layer is not relatively high. However, according to the method for fabricating a semiconductor device according to the first example embodiments of the present inventive concepts, the spacer 300 is first formed instead of first depositing the metal and then etching the deposited metal, and thus the method for fabricating a semiconductor device according to the first example embodiments of the present inventive concepts may be advantageous from the viewpoint of the etching selection ratio. That is, the spacer 300 can be formed without damaging the first interlayer insulating layer 100 and the barrier metal 230.

Further, in the case of first depositing the metal, an additional process for providing a capping layer may be used to prevent the damage. However, according to the method for fabricating a semiconductor device according to the first example embodiments of the present inventive concepts, such an additional process is not necessary, and the semiconductor device having the same structure can be fabricated more precisely.

Figure 9:
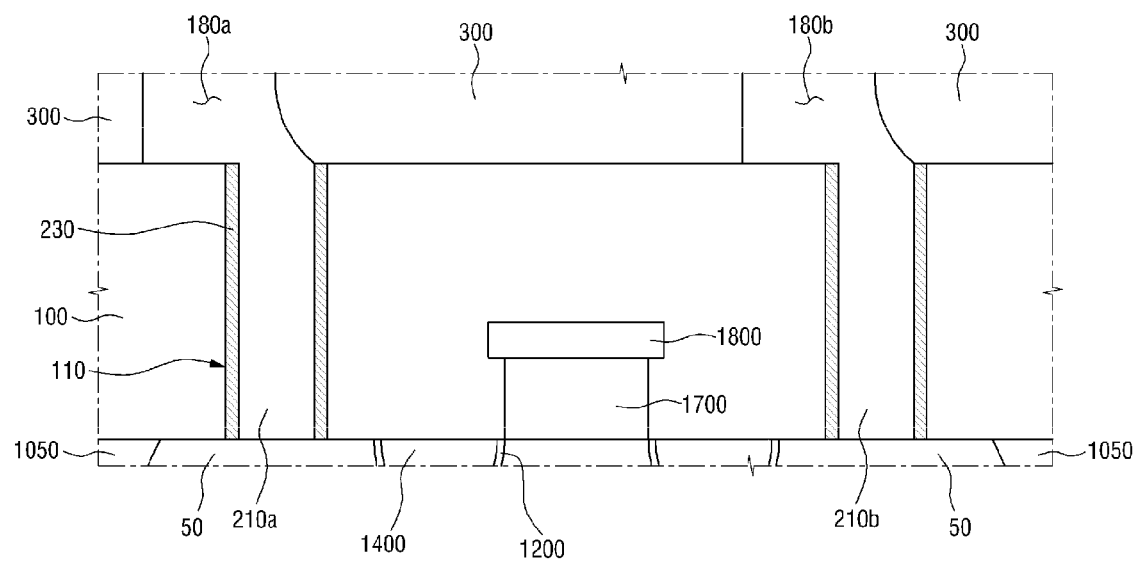

Then, referring to FIG. 9, the first sacrificial layer 150a and the second sacrificial layer 150b are removed. That is, the first sacrificial layer 150a that fills the first contact hole 110a and the second sacrificial layer 150b that fills the second contact hole 110b may be removed. Further, a second trench 180a and a third trench 180b having the spacers 300 as their side walls may be formed.

The second trench 180a may be formed on the first contact hole 110a and may have the spacer 300 as its side wall. The second trench 180a may be formed so that the center of the second trench 180a is shifted from the center of the first contact hole 110a in an opposite direction to the first direction (the rightward direction in FIG. 7). In FIG. 9, the opposite direction is illustrated as a leftward direction, but is not limited thereto.

The third trench 180b may be formed on the second contact hole 110b and may have the spacer 300 as its side wall. The third trench 180b may be formed so that the center of the third trench 180b is shifted from the center of the second contact hole 110b in an opposite direction to the first direction (the rightward direction in FIG. 7). In FIG. 9, the opposite direction is illustrated as a leftward direction, but is not limited thereto.

The first contact hole 110a may be formed on the bottom surface of the second trench 180a. The second trench 180a may have a horizontal cross-section that is wider than the first contact hole 110a. Accordingly, the second trench 180a may have the bottom surface except for a portion where the first contact hole 110a is formed.

The second contact hole 110b may be formed on the bottom surface of the third trench 180b. The third trench 180b may have a horizontal cross-section that is wider than the second contact hole 110b. Accordingly, the third trench 180b may have the bottom surface except for a portion where the second contact hole 110b is formed.

A process of removing the first sacrificial layer 150a and the second sacrificial layer 150b may be wet etching. In this case, the first sacrificial layer 150a and the second sacrificial layer 150b may be entirely removed using the etching selection ratio of the first sacrificial layer 150a, the second sacrificial layer 150b, and the first interlayer insulating layer 150b.

Then, referring to FIG. 4, the contact plugs 210a and 210b and the landing pads 220a and 220b are simultaneously formed by filling the first contact hole 110a, the second contact hole 110b, the second trench 180a, and the third trench 180b with the metal electrode.

A process of filling the first contact hole 110a, the second contact hole 110b, the second trench 180a, and the third trench 180b may be performed using, for example, chemical vapor deposition (CVD), plasma enhanced chemical vapor deposition (PECVD), physical vapor deposition (PVD), or atomic layer deposition (ALD), but is not limited thereto.

The process of filling the first contact hole 110a, the second contact hole 110b, the second trench 180a, and the third trench 180b may be electroless plating.

The electroless plating is to precipitate a metal or an alloy to be precipitated as a metal coating layer by chemical catalytic processing reaction. Accordingly, in this process, unlike electroplating, it is not required to use current.

Unlike the electroplating, the electroless plating does not require a seed layer on all filled portions. That is, even if the whole portion to be plated is not made of a conductor, metal can be plated using the conductor that is partially provided as a seed.

The bottom surface of the contact hole 110 of the semiconductor device according to the first example embodiments of the present inventive concepts may be a conductor. Specifically, the bottom surface may be a conductor that includes at least one of doped silicon, poly silicon, W, TiN, Ti, Ru, RuO, Co, $CoSi_x$, and $TiSi_x$.

The side surface of the contact hole 110 of the semiconductor device according to the first example embodiments of the present inventive concepts may include at least one of $SiO_2$, doped $SiO_2$, SiN, and SiCN. Specifically, the first interlayer insulating layer 100 may be made of an insulator.

In this case, the growth of the metal electrode that forms the contact plugs 210a and 210b and the landing pads 220a and 220b may have directivity that is from the bottom surface to the upper portion. Using this, structures of the contact plugs 210a and 210b and the landing pads 220a and 220b, which do not extend vertically, but are formed in an asymmetric shape, can be entirely filled. That is, through the electroless plating, the metal can be grown in a state where a gap or seam does not exist.

As described above, according to the method for fabricating a semiconductor device according to the first example embodiments of the present inventive concepts, the spacer 300 is first formed using the sacrificial layer 150 instead of first forming the metal electrode and etching the formed metal electrode. That is, the spacer 300 is first formed through etching of the sacrificial layer, which is relatively easier than etching of the metal. Through this, according to the method for fabricating a semiconductor device according to the first example embodiments of the present inventive concepts, reliability of the semiconductor device that includes the landing pads 220a and 220b in an asymmetric shape to secure the overlap margin can be heightened. That is, problems occurring during etching of the metal, for example, isolation inferiority and over-etching that causes the contact plugs to be cut, can be solved in advance. Further, additional processes for solving the above-described problems can be excluded and thus an economic fabricating process can be provided.

Further, the contact plugs 210a and 210b and the landing pads 220a and 220b can be formed by first forming the metal electrode on the bottom surface through the electroless plating using the bottom surface as a seed. Accordingly, the metal pattern in an asymmetric shape can be formed without the air gap.

Figure 16:
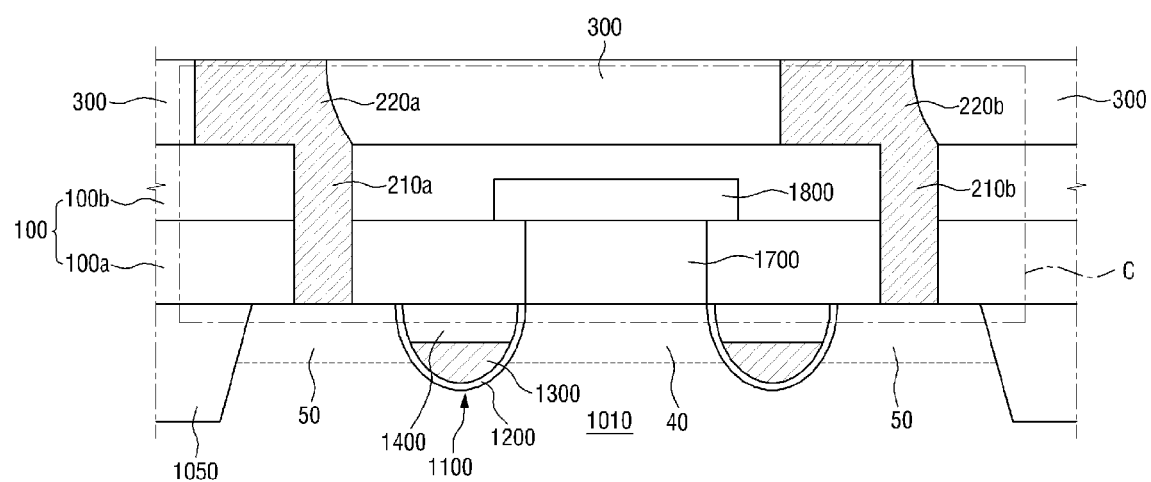

It has been described that the landing pads 220a and 220b are formed on the contact plugs 210a and 210b. However, according to other example embodiments of the present inventive concepts, the landing pads 220a and 220b can be omitted. FIG. 16 is a cross-sectional view of a semiconductor device according to third example embodiments of the present inventive concepts. As shown in FIG. 16, the asymmetric metal pattern on the contact plugs 210a and 210b may be directly used as the storage node 600 rather than the landing pads 220a and 220b. Even in the case of a semiconductor device having no landing pads 220a and 220b, it is required to secure the overlap margin, and even in the case where the storage node 600 itself is in an asymmetric shape, the overlap margin can be secured.

Hereinafter, referring to FIG. 10, a semiconductor device according to second example embodiments of the present inventive concepts will be described. Explanation of the duplicate contents as described above will be simplified or omitted.

Figure 10:
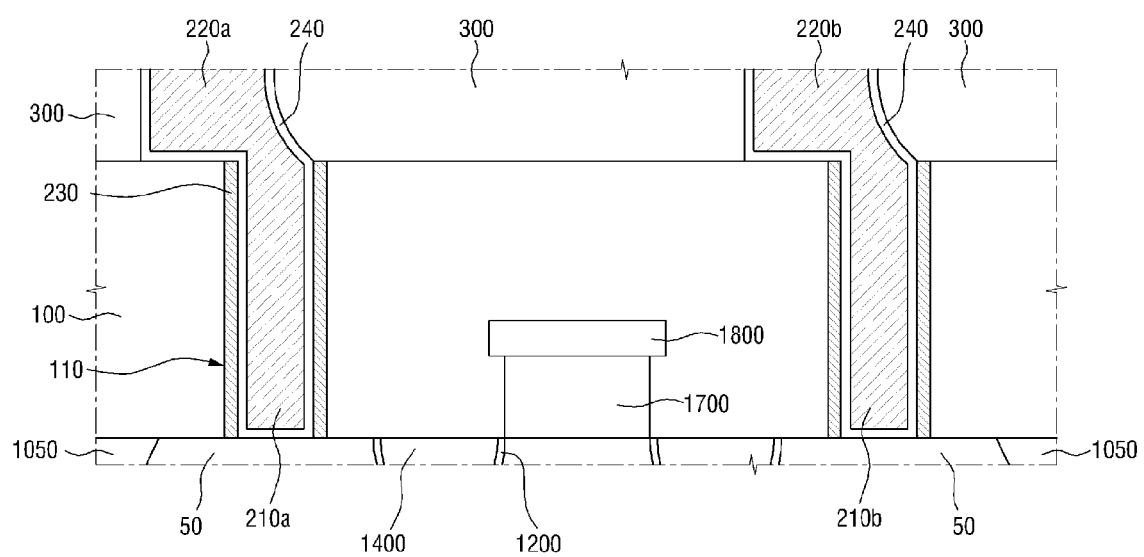

FIG. 10 is a cross-sectional view explaining a semiconductor chip according to second example embodiments of the present inventive concepts.

Referring to FIG. 10, a semiconductor device according to the second example embodiments of the present inventive concepts further includes a liner 240.

The liner 240 may be formed inside the first contact hole 110a, the second contact hole 110b, the second trench 180a, and the third trench 180b. The liner 240 may be conformally formed on the inside of the first contact hole 110a, the second contact hole 110b, the second trench 180a, and the third trench 180b. The liner 240 may serve as a seed layer of plating to form the contact plugs 210a and 210b and the landing pads 220a and 220b.

FIG. 10 illustrates that the liner 240 is discriminated from the contact plugs 210a and 210b and the landing pads 220a and 220b. However, the liner 240 may be made of the same material as the material of the conductor that forms the contact plugs 210a and 210b and the landing pads 220a and 220b, but is not limited thereto. The liner 240 may be made of a conductor. The liner 240 may include, for example, at least one of TiN, Ti, W, Co, Ru, RuO, and RuTiN.

Hereinafter, referring to FIGS. 5 to 11, a method for fabricating a semiconductor device according to the second example embodiments of the present inventive concepts will be described. Explanation of the duplicate contents as described above will be simplified or omitted.

Figure 11:
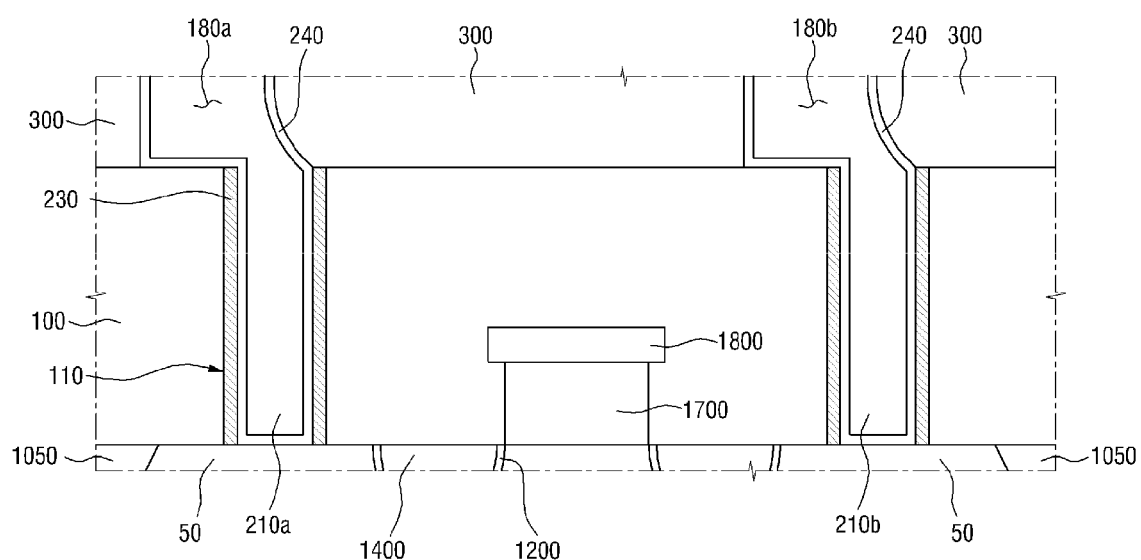

FIG. 11 is a view of an intermediate step explaining a method for fabricating a semiconductor device according to the second example embodiments of the present inventive concepts.

The method for fabricating a semiconductor device according to the second example embodiments of the present inventive concepts has the same processes as the processes according to the first example embodiments as illustrated in FIGS. 5 to 9.

Referring to FIG. 11, the liner 240 is formed inside the first contact hole 110a, the second contact hole 110b, the second trench 180a, and the third trench 180b.

The liner 240 may extend along inner walls of the first contact hole 110a and the second trench 180a. Further, the liner 240 may extend along inner walls of the second contact hole 110b and the third trench 180b. The liner 240 may be conformally formed inside the first contact hole 110a, the second contact hole 110b, the second trench 180a, and the third trench 180b. The liner 240 may serve as a seed layer of plating to form the contact plugs 210a and 210b and the landing pads 220a and 220b. The liner 240 may be made of a conductor. The liner 240 may include, for example, at least one of TiN, Ti, W, Co, Ru, RuO, and RuTiN.

Then, referring to FIG. 10, the metal electrode may be grown inside the first contact hole 110a, the second contact hole 110b, the second trench 180a, and the third trench 180b using the liner 240. In the first contact hole 110a and the second contact hole 110b, the metal electrode may become the contact plugs 210a and 210b. In the second trench 180a and the third trench 180b, the metal electrode may become the landing pads 220a and 220b.

Because the first contact hole 110a and the second trench 180a are connected to each other, the contact plugs 210a and 210b and the landing pads 220a and 220b in the first contact hole 110a and the second trench 180a can be formed at a time. In the same manner, because the second contact hole 110b and the third trench 180b are connected to each other, the contact plugs 210a and 210b and the landing pads 220a and 220b in the second contact hole 110b and the third trench 180b can be formed at a time.

The forming of the contact plugs 210a and 210b and the landing pads 220a and 220b using the liner 240 may be performed using a plating process. The plating process may be classified into electroless plating and electroplating. Both the electroless plating and the electroplating may be used in the method for fabricating a semiconductor device according to the second example embodiments of the present inventive concepts.

In the case of the electroplating, the plating is performed on the inside using current, and thus the liner 240 is essentially provided in places where the metal electrode is formed. Accordingly, the liner 240 may become an essential constituent element.

In the case of the electroless plating, the plating is chemical plating without the necessity of current, and thus the liner 240 may not be provided in all places where the metal electrode is formed, but the metal electrode can be formed using only the conductor that is partially provided.

However, in the case where the liner 240 is provided, the plating can be performed through the liner, and thus the processing time and efficiency can be increased.

Before the plating process, regardless of the electroplating or electroless plating, a pre-cleaning process may be performed. Through the pre-cleaning process, pollution materials in the first contact hole 110a, the second contact hole 110b, the second trench 180a, and the third trench 180b to be plated can be removed. Then, diffusion barriers may be formed. In this case, as materials of the barriers, Ti, TiN, Ta, and TaN may be used. Then, the liner 240 may be formed to perform the plating process.

Figure 12:
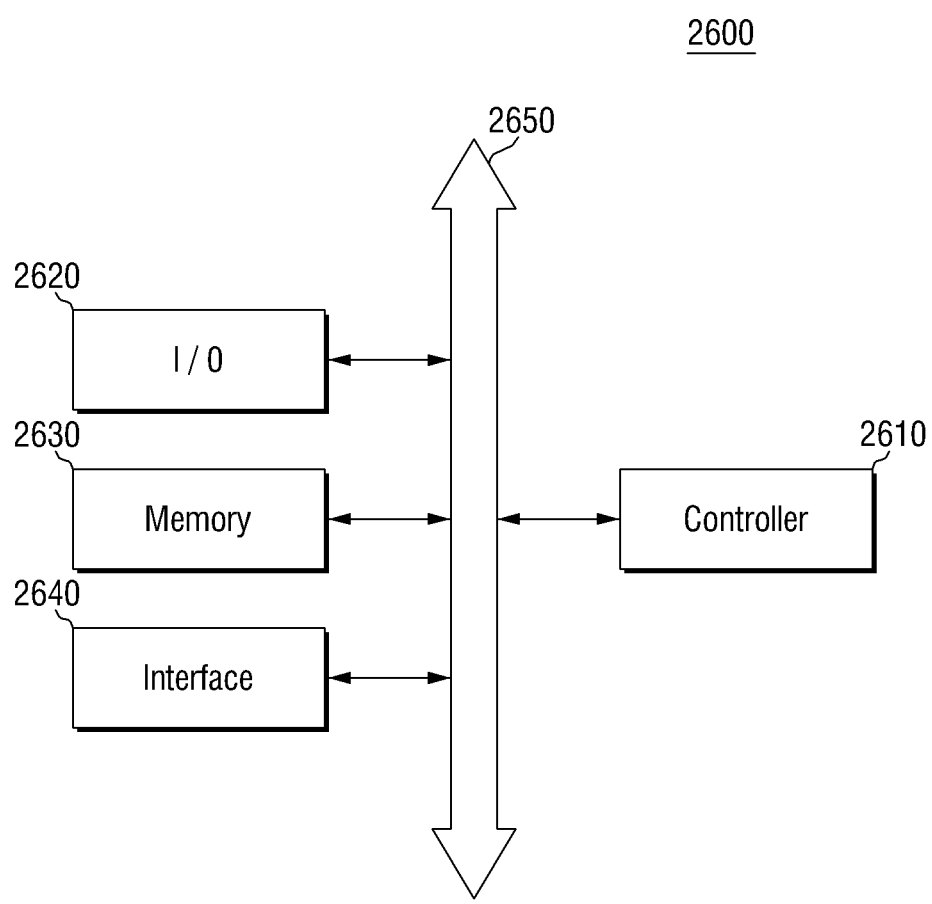

FIG. 12 is an exemplary block diagram of an electronic system including a semiconductor device according to some example embodiments of the present inventive concepts.

Referring to FIG. 12, an electronic system 2600 may include a controller 2610, an input/output (I/O) device 2620, a memory 2630, an interface 2640, and a bus 2650. The controller 2610, the I/O device 2620, the memory 2630 and/or the interface 2640 may be connected to each other through the bus 2650. The bus 2650 corresponds to paths through which data is transferred.

The controller 2610 may include at least one of a microprocessor, a digital signal processor, a microcontroller, and logic elements that can perform similar functions. The I/O device 2620 may include a keypad, a keyboard, and a display device. The memory 2630 may store data and/or commands. The memory 2630 may include the semiconductor device according to some embodiments of the present inventive concept. The memory 2630 may include a DRAM. The interface 2640 may function to transfer the data to a communication network or receive the data from the communication network. The interface 2640 may be of a wired or wireless type. For example, the interface 2640 may include an antenna or a wire/wireless transceiver.

The electronic system 2600 may be applied to a PDA (Personal Digital Assistant), a portable computer, a web tablet, a wireless phone, a mobile phone, a digital music player, a memory card, or all electronic devices that can transmit and/or receive information in wireless environments.

Figure 13:
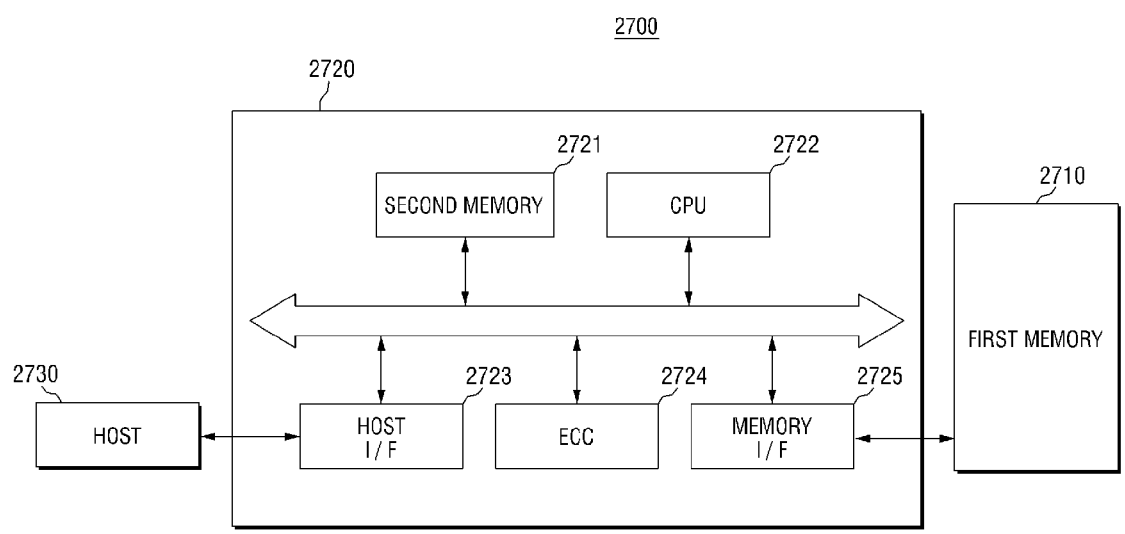

FIG. 13 is a block diagram illustrating an example of a memory card that includes a semiconductor device fabricated according to the method for fabricating a semiconductor device according to example embodiments of the present inventive concepts.

Referring to FIG. 13, a first memory 2710 that includes a semiconductor device fabricated according to various example embodiments of the present inventive concepts may be adopted in a memory card 2700. The memory card 2700 may include a memory controller 2720 that controls date exchange between a host 2730 and the first memory 2710.

A second memory 2721 may be used as a cache memory of a central processing unit 2722. The second memory 2721 may include a semiconductor device according to some example embodiments of the present inventive concepts. A host interface 2723 may include a protocol for the host 2730 to access the memory card 2700 to perform date exchange. An error correction code 2724 may detect and correct errors of data read from the first memory 2710. A memory interface 2725 may interface with the first memory 2710. The central processing unit 2722 may perform overall control operation related to data exchange with the memory controller 2720.

Figure 14:
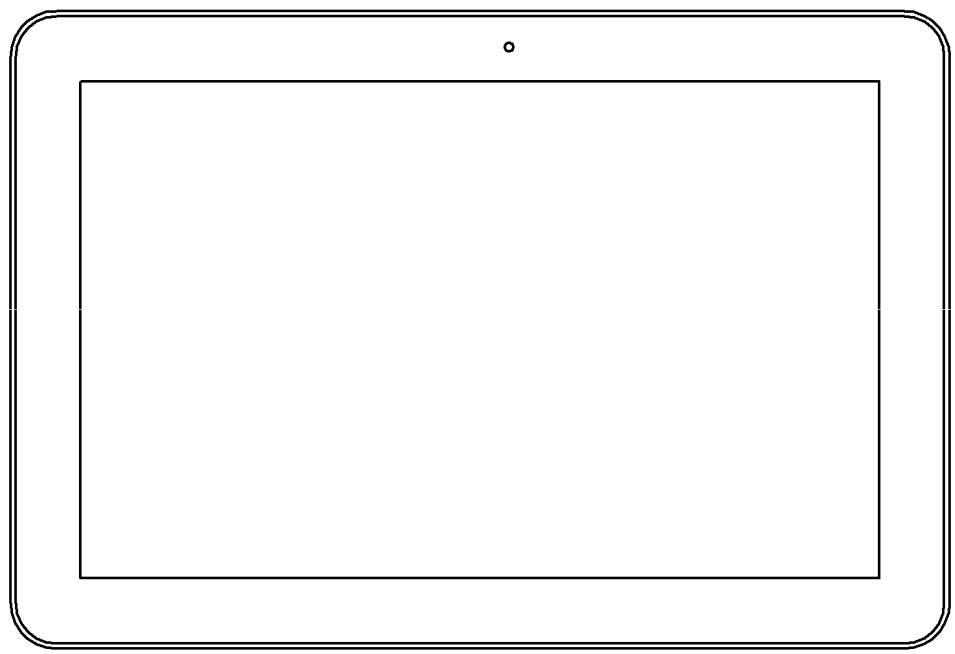
Figure 15:
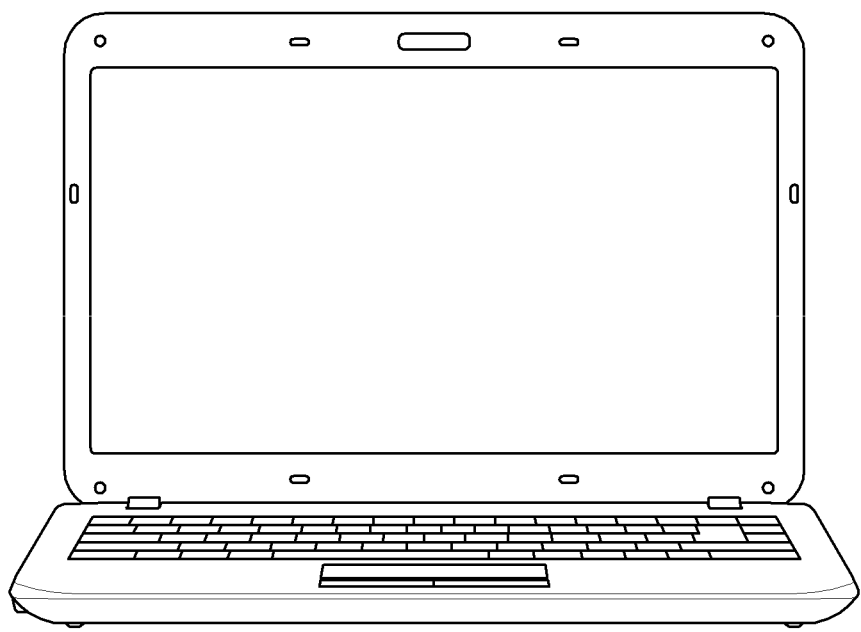

FIGS. 14 and 15 are views of exemplary semiconductor systems to which the semiconductor device according to some example embodiments of the present inventive concepts can be applied.

FIG. 14 illustrates a tablet PC, and FIG. 15 illustrates a notebook computer. It is apparent to those of skilled in the art that the semiconductor device according to some example embodiments of the present inventive concepts can be applied even to other integrated circuit devices that have not been exemplified.

While the present inventive concepts has been particularly shown and described with reference to exemplary embodiments thereof, it will be understood by those of ordinary skill in the art that various changes in form and details may be made therein without departing from the spirit and scope of the disclosure as defined by the following claims. It is therefore desired that the present example embodiments be considered in all respects as illustrative and not restrictive, reference being made to the appended claims rather than the foregoing description to indicate the scope of the disclosure.

What is claimed is:

1. A method for fabricating a semiconductor device, comprising:
   forming a transistor including first and second source/drain regions and a bit line connected to the first source/drain region of the transistor on a substrate;
   forming an interlayer insulating layer covering the transistor and the bit line;
   forming first and second contact holes exposing the second source/drain region of the transistor on both side surfaces of the bit line so as to penetrate the interlayer insulating layer;
   forming a sacrificial layer on the interlayer insulating layer and filling the first and second contact holes;
   forming a first trench separating the sacrificial layer filling the first contact hole and the sacrificial layer filling the second contact hole from each other by removing at least a part of the sacrificial layer;
   forming a spacer filling the first trench;
   forming a second trench on the first contact hole, and overlapping a part of the first contact hole and a part of the interlayer insulating layer on a side surface of the first contact hole, by removal of a first portion of a remainder of the sacrificial layer;

forming a third trench on the second contact hole, and overlapping a part of the second contact hole and a part of the interlayer insulating layer on a side surface of the second contact hole, by removal of a second portion of the remainder of the sacrificial layer;

forming a contact plug pattern filling the first and second contact holes; and forming a metal pattern filling the second and third trenches.

2. The method for fabricating a semiconductor device of claim 1, wherein the forming the contact plug pattern and the forming the metal pattern are performed simultaneously.

3. The method for fabricating a semiconductor device of claim 1, wherein the sacrificial layer includes a material having an etching selection ratio higher than an etching selection ratio of the spacer, and the removal of the first and second portions of the sacrificial layer are performed by wet etching.

4. The method for fabricating a semiconductor device of claim 3, wherein the sacrificial layer includes an oxide-based material, and the spacer includes a nitride-based material.

5. The method for fabricating a semiconductor device of claim 1, wherein a horizontal cross-section of the second trench is wider than a horizontal cross-section of the first trench.

6. The method for fabricating a semiconductor device of claim 1, wherein the forming the contact plug pattern is performed using chemical vapor deposition (CVD), physical vapor deposition (PVD), or electroless plating.

7. The method for fabricating a semiconductor device of claim 1, wherein the first trench is formed to overlap the part of the first contact hole.

8. The method for fabricating a semiconductor device of claim 7, wherein the first trench is formed so that a center of the first trench is shifted from a center of the first contact hole in a first direction, and the second trench is formed so that a center of the second trench is shifted from the center of the first contact hole in a second direction opposite to the first direction.

9. The method for fabricating a semiconductor device of claim 1, wherein the contact plug pattern entirely fills the first and second contact holes.

10. A method for fabricating a semiconductor device, comprising:

forming a contact hole penetrating an interlayer insulating layer and exposing a conductor defining a bottom surface of the contact hole;

forming a sacrificial layer filling the contact hole;

forming a first trench overlapping a part of the contact hole by removing at least a part of the sacrificial layer;

forming a spacer filling the first trench;

forming a second trench by removing a remainder of the sacrificial layer; and forming a metal electrode filling the contact hole and the second trench using electroless plating.

11. The method for fabricating a semiconductor device of claim 10, wherein the metal electrode includes at least one of selected from the group consisting of W, Co, Ni, Cu, Ru, Pd, Ag, Pt, Au, In, Sn, CoW, CoWP, and NiB.

12. The method for fabricating a semiconductor device of claim 10, wherein the interlayer insulating layer includes at least one selected from the group consisting of $SiO_2$, doped $SiO_2$, SiN, and SiCN.

13. The method for fabricating a semiconductor device of claim 10, further comprising:

forming a barrier metal on the contact hole and the interlayer insulating layer, after forming the contact hole.

14. The method for fabricating a semiconductor device of claim 13, further comprising:

adjusting conductivity by doping the barrier metal.

15. The method for fabricating a semiconductor device of claim 10, further comprising:

forming a liner inside the contact hole, the first trench, and the second trench, wherein the liner includes at least one selected from the group consisting of TiN, Ti, W, Co, Ru, RuO, and RuTiN.

16. A method for fabricating a semiconductor device, comprising:

forming a transistor including a first conductive region and a second conductive region on a substrate;

forming an interlayer insulating pattern on the transistor, wherein the interlayer insulating pattern has a first contact hole and a second contact hole separated from each other, and the first conductive region is exposed by the first contact hole and the second conductive region is exposed by the second contact hole; and forming a sacrificial layer on the interlayer insulating pattern and filling the first and second contact holes;

forming a first trench separating the sacrificial layer filling the first contact hole and sacrificial layer filling the second contact hole from each other by removing at least a part of the sacrificial layer;

forming a spacer filling the first trench;

forming a second trench on the first contact hole, and overlapping a part of the first contact hole and a part of the interlayer insulating pattern on a side surface of the first contact hole, by removing a first portion of a remainder of the sacrificial layer;

forming a third trench on the second contact hole, and overlapping a part of the second contact hole and a part of the interlayer insulating pattern on a side surface of the second contact hole, by removing a second portion of the remainder of the sacrificial layer;

filling the first contact hole with a first contact plug and the second contact hole with a second contact plug; and forming a metal pattern filling the second and third trenches, wherein the first and second contact plugs are each formed collectively of a first metal pattern and a second metal pattern arranged along different longitudinal axes.

17. The method of claim 16, wherein the forming the interlayer insulating pattern includes, forming a first interlayer insulating pattern having a first preliminary contact hole exposing the first conductive region and a second preliminary contact hole exposing the second conductive region, filling the first and second preliminary contact holes with the sacrificial layer, and etching the sacrificial layer to form a first sacrificial layer and a second sacrificial layer separated from each other by the first trench.

18. The method of claim 17, wherein the sacrificial layer is formed of a material having an etching selection ratio with respect to the first interlayer insulating layer pattern.

19. The method of claim 16, wherein the interlayer insulating pattern is formed with non-linear sidewalls forming each of the first and second contact holes.

20. The method of claim 16, wherein the second metal pattern is a storage node.

* * * * *